US006211052B1

(12) United States Patent
Farnworth

(10) Patent No.: US 6,211,052 B1
(45) Date of Patent: *Apr. 3, 2001

(54) MASK REPATTERN PROCESS

(75) Inventor: Warren M. Farnworth, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/464,988

(22) Filed: Dec. 16, 1999

Related U.S. Application Data

(63) Continuation of application No. 09/179,310, filed on Oct. 27, 1998, now Pat. No. 6,083,820, which is a continuation of application No. 08/767,162, filed on Dec. 16, 1996, now Pat. No. 5,851,911, and application No. 08/682,141, filed on Jul. 17, 1996, now Pat. No. 5,736,456, which is a continuation-in-part of application No. 08/612,059, filed on Mar. 7, 1996, now Pat. No. 6,072,236.

(51) Int. Cl.[7] .................................................. H01L 21/44
(52) U.S. Cl. ............................................. 438/614; 438/640
(58) Field of Search ..................................... 438/614, 622, 438/637, 640

(56) References Cited

U.S. PATENT DOCUMENTS

| | | |
|---|---|---|
| 3,761,782 | 9/1973 | Youmans . |
| 4,074,342 | 2/1978 | Honn et al. . |
| 4,670,770 | 6/1987 | Tai . |
| 4,709,468 | 12/1987 | Wilson . |
| 4,829,014 | 5/1989 | Yerman . |
| 4,890,157 | 12/1989 | Wilson . |
| 4,948,754 | 8/1990 | Kondo et al. . |
| 5,106,461 | 4/1992 | Volfson et al. . |
| 5,137,845 | 8/1992 | Lochon et al. . |
| 5,198,684 | 3/1993 | Sudo . |
| 5,219,117 | 6/1993 | Lin . |
| 5,224,265 | * 7/1993 | Dux et al. . |
| 5,246,880 | * 9/1993 | Reele et al. . |
| 5,327,013 | * 7/1994 | Moore et al. . |
| 5,404,265 | * 4/1995 | Moresco et al. . |
| 5,436,411 | * 7/1995 | Pasch . |
| 5,502,002 | * 3/1996 | Wong et al. . |
| 5,505,366 | * 4/1996 | Nishi et al. . |
| 5,604,379 | * 2/1997 | Mori . |
| 5,677,576 | * 10/1997 | Akagawa . |
| 5,719,448 | * 2/1998 | Ichikawa . |
| 5,851,911 | * 12/1998 | Farnworth ............................ 438/614 |

* cited by examiner

Primary Examiner—Kevin M. Picardat
(74) Attorney, Agent, or Firm—Trask Britt

(57) ABSTRACT

The present invention relates to an improve method for forming a UBM pad and solder bump connection for a flip chip which eliminates at least two mask steps required in standard UBM pad forming processes when repatterning the bond pad locations.

19 Claims, 6 Drawing Sheets

MASK REPATTERN PROCESS

CROSS REFERENCE TO RELATED APPLICATIONS

This application is a continuation of application Ser. No. 09/179,310, filed Oct. 27, 1998, now U.S. Pat. No. 6,083,820, which is a continuation of application Ser. No. 08/767,162, filed Dec. 16, 1996, now U.S. Pat. No. 5,851,911, issued Dec. 22, 1998, which is a continuation-in-part of application Ser. No. 08/612,059, filed Mar. 7, 1996, now U.S. Pat. No. 6,072,236, and application Ser. No. 08/682,141, filed Jul. 17, 1996, now U.S. Pat. No. 5,736,456, issued Apr. 7, 1998.

BACKGROUND OF THE INVENTION

1. Field of the Invention

The present invention relates to a method of repatterning circuits and the like on semiconductor devices. More specifically, the present invention relates to a method for forming conductive bumps on a die for flip chip type attachment to a printed circuit board or the like after the repatterning of a circuit on a semiconductor device. In particular, the present invention relates to a method for forming under bump metallization pads, which method utilizes simplified or a minimal number of masking steps.

2. State of the Art

The following terms and acronyms will be used throughout the application and are defined as follows:

BGA—Ball Grid Array: An array of minute solder balls disposed on conductive locations of an active surface of a semiconductor die, wherein the solder balls are refluxed for simultaneous attachment and electrical communication of the semiconductor die to conductors of a printed circuit board or other substrate.

Flip Chip: A chip or die that has a pattern or array of terminations spaced around the active surface of the die for face-down mounting of the die to a substrate.

Flip Chip Attachment: A method of attaching a semiconductor die to a substrate in which the die is inverted so that the connecting conductor pads on the face of the device are set on mirror-image pads of conductive traces carried by the substrate and bonded thereto by solder reflux. Also, sometimes known as C4 attachment ("Controlled Collapse Chip Connection").

SLICC—Slightly Larger than Integrated Circuit Carrier: An array of minute solder balls disposed on an attachment surface of a semiconductor die similar to a BGA, but having a smaller solder ball diameter and pitch than a BGA.

High performance microelectronic devices may comprise a number of flip chips having a BGA or a SLICC attached to a ceramic or silicon substrate or printed circuit board ("PCB") such as an FR4 board for electrical interconnection to other microelectronic devices. For example, a very large scale integration ("VLSI") chip may be electrically connected to a substrate, printed circuit board, or other next higher level packaging carrier member using solder balls or solder bumps. This connection technology may be referred to generically as "flip chip" or "C4" attachment.

Flip chip attachment requires the formation of contact terminals at flip chip contact sites on the semiconductor die, each site consisting of a metal pad with a lead/tin solder ball formed thereon. Flip chip attachment also requires the formation of solder joinable sites ("pads") on the metal conductors of the PCB or other substrate or carrier which are a mirror-image of the solder ball arrangement on the flip chip. The pads on the substrate are usually surrounded by non-solderable barriers so that when the solder balls of the chip contact sites are aligned with the substrate pads and "reflow", the surface tension of the liquified solder element supports the semiconductor chip above the substrate. After cooling, the chip is essentially welded face-down by very small, closely spaced, solidified solder interconnections. An underfill encapsulant is generally disposed between the semiconductor die and the substrate for environmental protection and to further enhance the mechanical attachment of the die to the substrate.

FIGS. 1a–h show a contemporary, prior art method of forming a conductive ball arrangement on a flip chip. First, a plurality of semiconductor devices, such as dice including integrated circuitry (not shown), is fabricated on a face surface 12 of a semiconductor wafer 10. A plurality of conductive traces 14 is then formed on the semiconductor wafer face surface 12 positioned to contact circuitry of the respective semiconductor elements (not shown), as in FIG. 1a. A passivation film 16, such as at least one layer of $SiO_2$ film, $Si_3N_4$ film, or the like, is formed over the semiconductor wafer face surface 12 as well as the conductive traces 14, as shown in FIG. 1b. A first layer of etchant-resistive photoresist film 18 is subsequently applied to a face surface 20 of the passivation film 16. The first photoresist film 18 is next masked, exposed, and stripped to form desired openings (one illustrated) in the first photoresist film 18. The passivation film 16 is then etched through the opening in photoresist film 18 to form a via 22 with either sloped edges or walls 26, or even substantially vertical walls, and which exposes a face surface 24 of the conductive trace 14, as shown in FIG. 1c. Photoresist 18 is then stripped, as shown in FIG. 1d.

FIG. 1e shows metal layers 28, 30, and 32 applied over the passivation film face surface 20 as well as the via 22 to form a multi-layer under bump metallurgy (UBM) 34 by chemical vapor deposition (CVD), plasma-enhanced chemical vapor deposition (PECVD), physical vapor deposition (PVD), either sputtering or evaporation. The metal layers usually comprise chromium for the first or base adhesion layer 28, chromium-copper alloy for a second, intermediate layer 30, and copper for the third, outer soldering layer 32. Additionally, a fourth metal layer (not shown) of flashed gold is occasionally placed atop the copper third layer 32 to prevent oxidation of the copper. Nickel, palladium, and platinum have also been employed as the outer or soldering layer 32. Furthermore, titanium or titanium/tungsten alloys have been used as alternatives to chromium for the adhesion layer. Two-layer UBMs with a gold flash coating are also known, as are single-layer UBMs.

A second layer of etchant-resistive photoresist film 35 is then masked, exposed, and stripped to form at least one second etchant-resistive block 36 over the vias 22, as shown in FIG. 1f. The metal layers 28, 30, and 32 surrounding vias 22 are then etched and the etch-resistive block 36 is stripped to form a discrete UBM pad 40, as shown in FIG. 1g. A solder bump 42 is then formed on the UBM pad 40, as shown in FIG. 1h, by any known industry technique, such as stenciling, screen printing, electroplating, electroless plating, evaporation or the like.

The UBM pads 40 can also be made by selectively depositing the metal layers by evaporation through a mask (or photoengraving) onto the passivation film face surface 20 as well as the via 22 such that the metal layers 28, 30, and 32 correspond to the exposed portions of the conductive traces 14.

Solder balls are generally formed of lead and tin. High concentrations of lead are sometimes used to make the bump more compatible with subsequent processing steps. Tin is added to strengthen bonding (to such metal as copper) and serves as an antioxidant. High-temperature (melting point of approximately 315 degrees Centigrade) solder alloy has been used to join chips to thick ceramic substrates and a multi-layer coffered ceramic interface modules. Joining chips to organic carriers, such as polyamide-glass, polyamide-aramid, and the like as well as the printed wiring boards, requires lower temperatures which may be obtained by using 63Sn/37Pb solder (melting point 183 degrees Centigrade) and various Pb/In alloys, such as 50Pb/50In (melting point of approximately 220 degrees Centigrade). Lower melting point alloys (down to 60 degrees Centigrade) have been used to bump very temperature-sensitive chips, such as GaAs and superconducting Josephson junctions.

Numerous techniques have been devised to improve the UBM and formation of solder bumps for flip chips. For example, U.S. Pat. No. 4,360,142, issued Nov. 23, 1982, to Carpenter et al. relates to forming multiple layer UBM pads between a semiconductor device and a supporting substrate particularly suited to high stress use conditions that generate thermal gradients in the interconnection.

U.S. Pat. No. 5,137,845, issued Aug. 11, 1992, to Lochon et al. pertains to a method of forming solder bumps and UBM pads of a desired size on semiconductor chips based on an involved photolithographic technique such that the dimensions of the solder bumps can be reduced in order to increase the number of bumps on a chip.

U.S. Pat. No. 5,470,787, issued on Nov. 28, 1995, to Greer relates to a substantially cylindrical layered solder bump wherein the bump comprises a lower tin layer adjacent to the UBM pad, a thick lead layer, and an upper tin layer to provide an optimized, localized eutectic formation at the top of the bump during solder reflow.

U.S. Pat. Nos. 4,906,341, 5,293,006, 5,341,946, and 5,480,835 also disclose materials and techniques for forming UBM pads and solder bumps.

All of the above patents and prior art techniques for forming UBM pads and solder bumps are relatively complex and require a substantial number of discrete steps and number of masking steps to form the flip chip conductive bumps. Therefore, it would be advantageous to develop an efficient technique for forming conductive bump structures on a flip chip to eliminate as many steps as required by present industry standard techniques while using commercially-available, commonly practiced semiconductor device fabrication materials and techniques.

SUMMARY OF THE INVENTION

The present invention relates to a method for repatterning circuits and the like on semiconductor devices. The present invention relates to a method for forming under bump metallization pads on semiconductor devices using simplified masking steps.

BRIEF DESCRIPTION OF THE SEVERAL VIEWS OF THE DRAWINGS

The advantages of the invention will be more readily understood from the following description of the invention when taken in conjunction with the accompanying drawings wherein.

DETAILED DESCRIPTION OF THE INVENTION

Figure 1A:
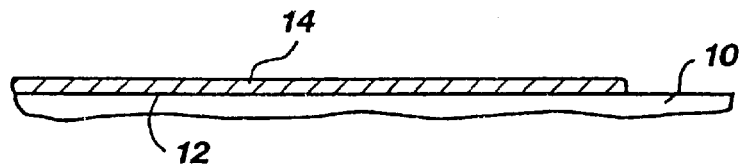
FIGS. 1a–1h are cross sectional views of a prior art process of forming flip chip solder bump connections.
Figure 1B:
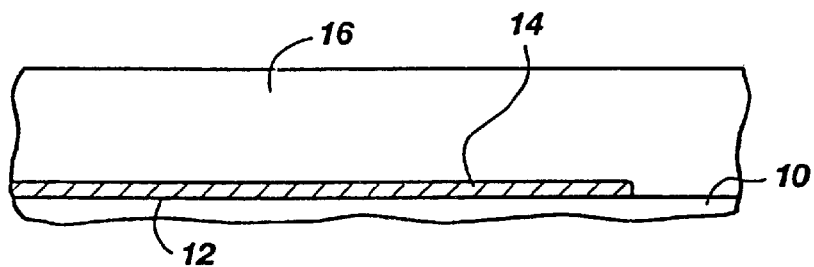
Figure 1C:
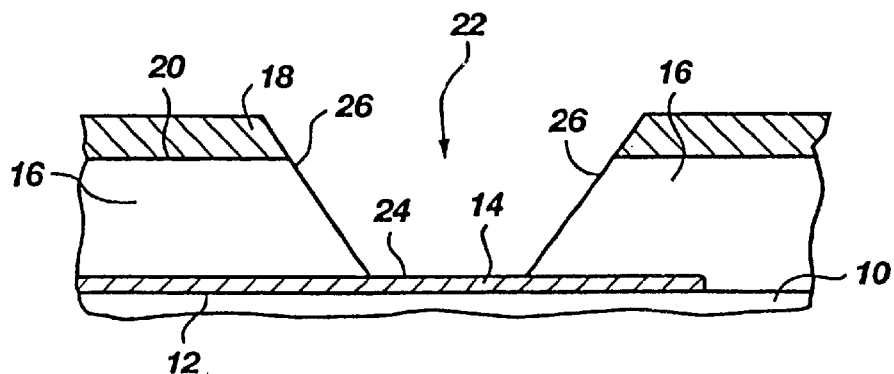
Figure 1D:
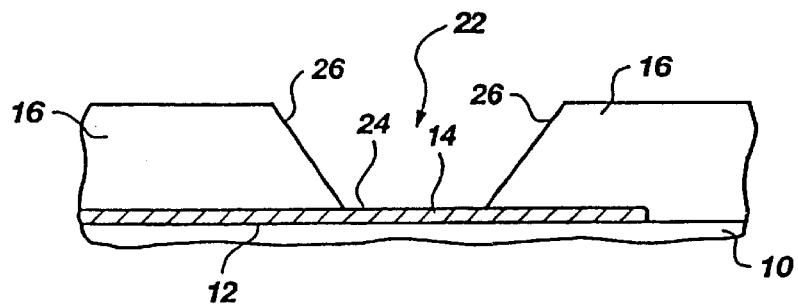
Figure 1E:
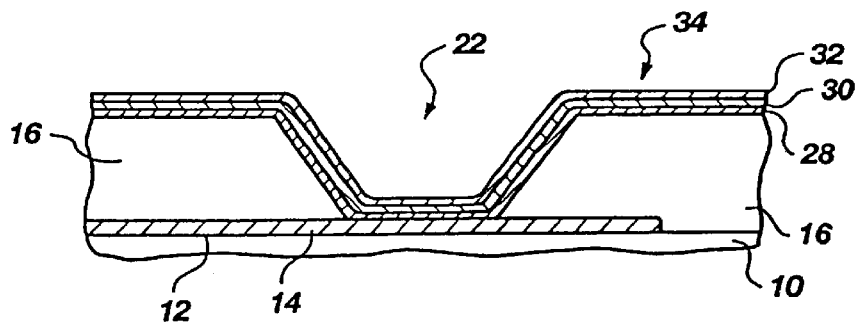
Figure 1F:
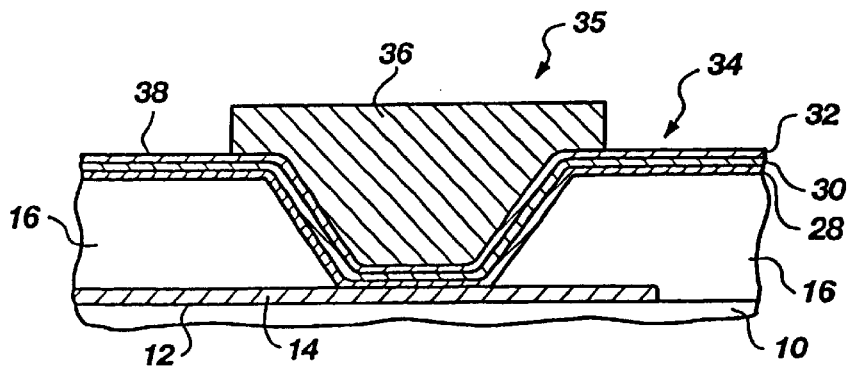
Figure 1G:
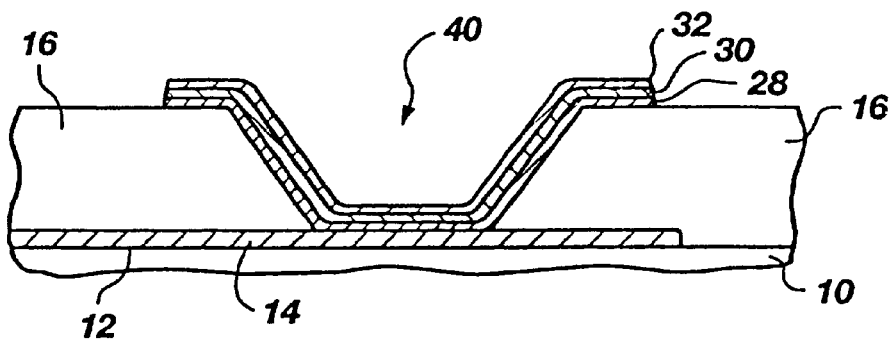
Figure 1H:
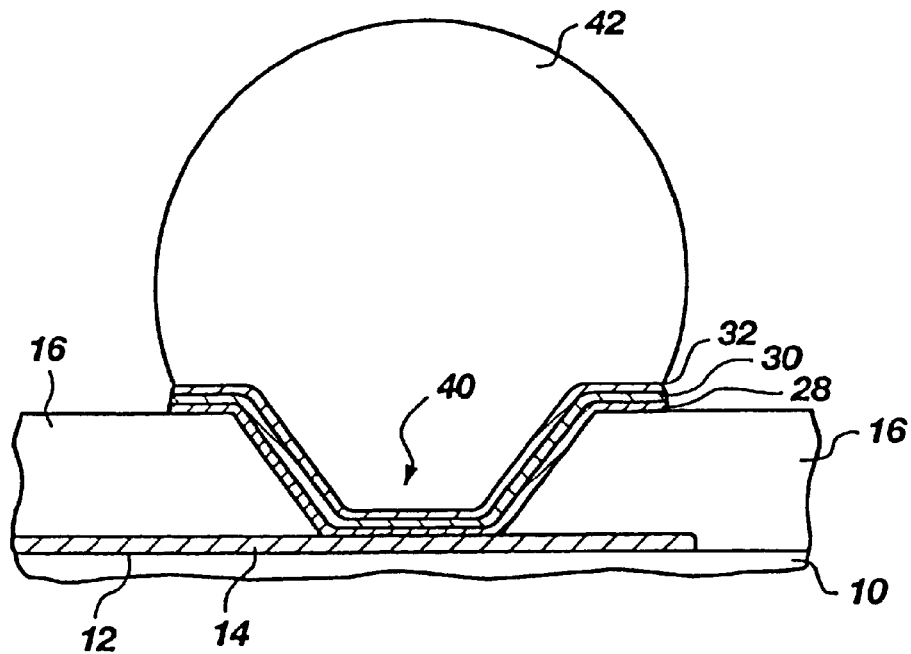
Figure 2A:
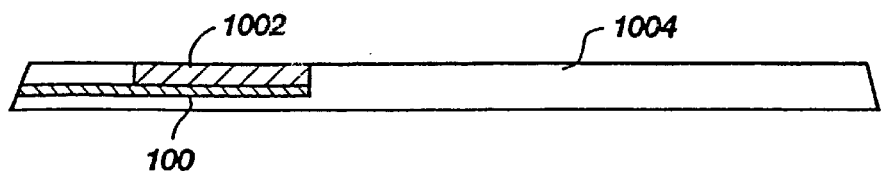
FIGS. 2a–2h illustrate a method for repatterning the active surface of a flip chip.
Figure 2B:
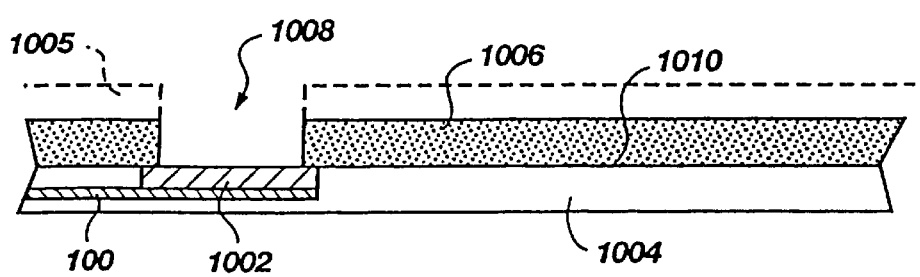

Referring to drawing FIGS. 2a–2h, the method of the present invention for repatterning the circuits on a flip chip is illustrated. Specifically, referring to drawing FIG. 2a, a semiconductor substrate or wafer 1004 includes a bond pad 1002 connected to a circuit 100. As shown in FIG. 2b, a first layer of passivation film 1006 is applied over a face surface or active surface 1010 of the semiconductor wafer 1004. The passivation layer 1006 is preferably a suitable polyamide layer. The polyamide passivation layer 1006 is typically formed by spin coating a mixture of diamine and dianhydride monomers in a solvent, usually N-methyl-pyrrolidine 2 (NMP). Depending upon the predetermined formulation of the polyamide, the thickness of the polyamide coating is directly related to the speed of rotation of the wafer. The monomers combine at low temperature to form polyamic acid, which is soluble in NMP. The passivation film is subsequently dried at approximately 100° C. to initially remove most of the solvent and further dried at 250–400° C. to ensure complete solvent removal and the conversion to polyamide. If the pyromellitic dianhydride-oxydianiline (PMDA-QDA) family of polyamides is used, such polyamides are isotropic in behavior, while long polymer chain biphenyldiaminine-phenyldiamine (BPDA-PDA) polyamides tend to be anisotropic in mechanical and electrical properties. Either type of polyamide can be used for the passivation layer. In this manner the polyamide is capable of absorbing the thin film stresses imparted from the deposition of the interconnection by the solder.

Still referring to drawing FIG. 2b, a photoresist 1005 is applied, masked and exposed (broken lines). The passivation film 1006 is then etched using well known etching techniques to form a bond pad via 1008 through the passivation film 1006 to the bond pad 1002, as shown.

Figure 2C:
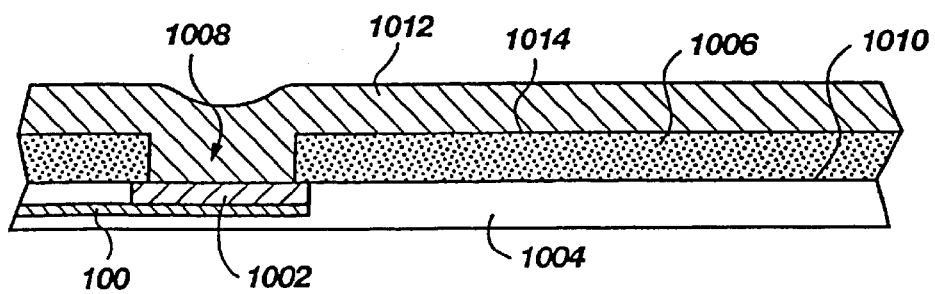

Referring to drawing FIG. 2c, a conductive layer 1012, preferably a solder wettable metal, is applied over a face surface 1014 of the passivation film 1006. The conductive layer is preferably a metal such as copper, nickel, palladium, platinum, gold, or alloys thereof that is capable of being easily wetted by solder and alloys thereof.

Figure 2D:
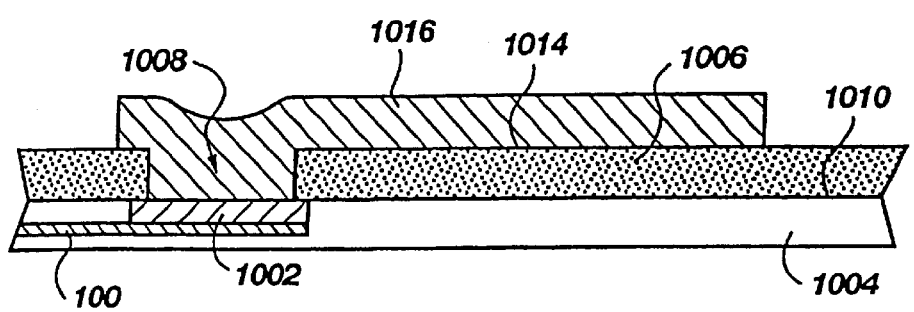

Referring to drawing FIG. 2d, the conductive layer 1012, shown in FIG. 2c, is photoresist-coated, masked, exposed, and etched using well known techniques to form at least one conductive repattern trace 1016 extending to a substitute or alternative bond pad location, as shown in FIG. 2d.

Figure 2E:
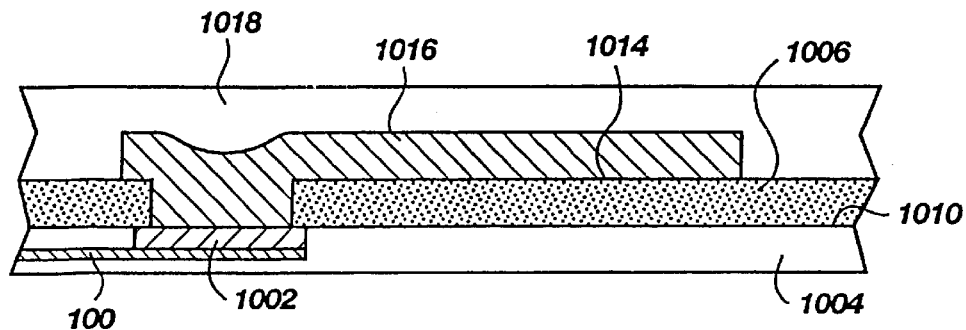

Referring to drawing FIG. 2e, a second passivation film 1018, such as a spin-on polyamide layer described hereinbefore, is applied over the repattern trace 1016, as shown.

Figure 2F:
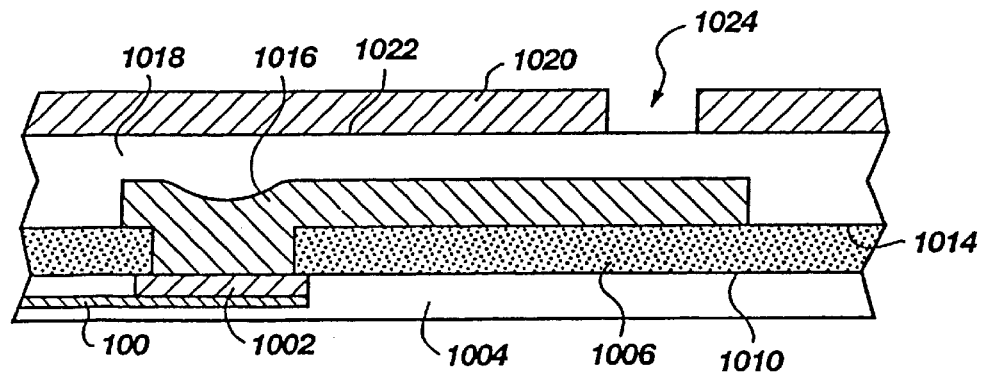

Referring to drawing FIG. 2f, a suitable etch resistant layer 1020 (photoresist) is applied over an upper surface 1022 of the second passivation film 1018, masked, and etched to form a resist via 1024 at the alternative, repatterned bond pad location, as shown.

Figure 2G:
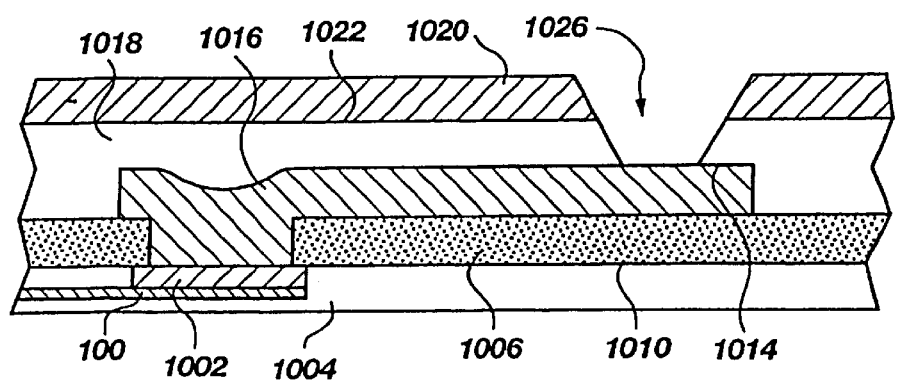

Referring to drawing FIG. 2g, a faceted or sloped-wall via 1026 is shown as etched according to the following preferred processes. A sputter etching process for forming sloped vias 1026 begins with providing a semiconductor wafer assembly comprising a semiconductor wafer with a plurality of semiconductor elements (dice) including integrated circuitry formed on the face (active) surface and with the plurality of conductive traces and bond pads also formed on the semiconductor wafer face surface positioned to contact respective semiconductor element circuitry. A passivation film is disposed over the semiconductor wafer face surface as well as the conductive traces and pads. A first layer of etch resist film, such as a photoresist, is applied to the face surface of the passivation film, then masked, exposed, and stripped to form desired openings in the first etch resist film. After a short period of time being subjected to sputter etching, sloped edges begin to form on the etch resist film as the wafer is sputtered and both resist film and passivation film are etched. The sputtering process continues and sloped edges or walls begin to form in the passivation film after the resist is penetrated.

Alternately, a wet etching process for forming vias may be used. The process begins with providing a semiconductor wafer assembly comprising a semiconductor wafer with a plurality of semiconductor elements or circuitry formed on the face surface and with the plurality of conductive traces and bond pads also formed on the semiconductor wafer face surface positioned to contact respective semiconductor element circuitry. A passivation film is disposed over the semiconductor wafer face surface as well as the conductive traces and pads. A first layer of etch resist film (photoresist or other film, depending upon the intended etchant and temperature) is applied to the face surface of the passivation film. The first etch resist film is then masked, exposed, and stripped to form desired openings in the first etch resist film.

An appropriate acid such as a 1:2 ratio mix of ammonium fluoride and acetic acid or a 100:1 ratio mix of $H_2O$ and HF acid for etching an SiO film, or hot (150–180° C.) phosphoric acid in the case of an $Si_3N_4$ film, is then applied to the surface of the wafer. Other suitable etchants, as known in the art, may be employed in the case of polymer-based films, such as polyamides. After a short period of time of etching, a concave recess begins to form on the passivation film. The process continues until the etching forms the sloped via having somewhat arcuate or curved sloped edges and which exposes the face surface of the conductive electrode. Resist is then stripped. An etch performed as described above forms a wall angle of the via with respect to the horizontal which is desirable for solder ball formation by increasing surface area exposed to shear forces. Thus, as shown, a UBM structure is formed.

Figure 2H:
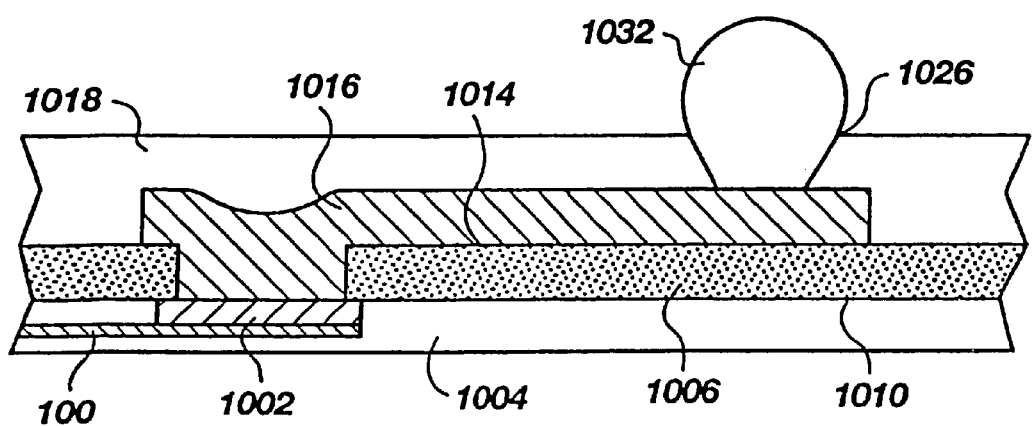

Referring to drawing FIG. 2h, a solder ball 1032 is formed in the via 1026 in contact with the conductive repattern trace 1016.

It is, of course, understood that, although the above description is generally directed to fabrication on a wafer scale, the method is equally applicable to single chips or portions of wafers.

It will also be understood that a solid preform comprising a "blank" of substrate material (such as Si) may be employed over the exposed trace ends of the wafer to define vias anisotropically wet-etched and plated with metal to define the UBM. For purposes of this invention, a preform Si blank may also be considered as a passivation layer. Techniques for such via and UBM formation are disclosed in co-pending U.S. patent application Ser. No. 08/612,159, filed Mar. 7, 1996 and assigned to assignee of the present invention, the disclosure of which is incorporated herein by this reference. The anisotropic wet etch of the silicon blank may be effected by a $KOH:H_2O$ mixture, resulting in a preferred 54° via wall angle to the horizontal for formation of a solder ball therein.

Having thus described in detail the preferred embodiment of the present invention, it is to be understood that the invention defined by the appended claims is not to be limited by particular details set forth in the above description, as many apparent variations thereof are possible without departing from the spirit or scope thereof.

What is claimed is:

1. A method of relocating a conductive element of a semiconductor substrate, said method comprising the steps of:

forming a semiconductor substrate having integrated circuitry, having at least one surface, and having at least one conductive circuit on a portion of said at least one surface of said substrate connected to a portion of said circuitry, said at least one conductive circuit terminating in a bond pad, said at least one conductive circuit having a portion thereof covered by at least one first passivation layer except for said bond pad;

forming a conductive trace of solder wettable material from said bond pad of said at least one conductive circuit to a location for another conductive element on said at least one surface of said semiconductor substrate, said conductive trace of solder wettable material contacting at least a portion of said bond pad of said at least one conductive circuit and extending over a portion of said at least one first passivation layer, said conductive trace of solder wettable material having a first surface and a second surface, a portion of said second surface contacting a portion of said bond pad;

forming at least one second passivation layer over a portion of said at least one surface of said semiconductor substrate and said conductive trace; and etching a sloped-wall via through said at least one second passivation layer extending to a portion of said first surface of said conductive element at said location for another conductive trace located on said at least one surface of said semiconductor substrate.

2. The method of claim 1, wherein said etching is selected from the group comprising sputter etching and wet etching.

3. The method of claim 2, wherein said etching comprises sputter etching after application of a resist layer over said second passivation layer, said resist layer having an aperture therein aligned with said location for another conductive element located on said at least one surface of said semiconductor substrate.

4. The method of claim 1, further comprising the step of: depositing a solder mass over said sloped-wall via.

5. The method of claim 4, further comprising the step of: liquefying said solder mass and cooling said solder mass to define a solder ball or bump.

6. The method of claim 1, wherein said at least one conductive circuit is selected from the group consisting of bond pads and conductive traces.

7. A method of forming under bump metallization, said method comprising the steps of:

forming a semiconductor substrate having integrated circuitry and having at least one surface, said substrate including at least one solder wettable conductive trace on said at least one surface connected to a portion of said circuitry and having at least one passivation layer over at least a portion of said at least one surface; and forming a sloped-wall via in a portion of said at least one passivation layer to expose a portion of said at least one conductive trace.

8. The method of claim 7, wherein said forming said sloped-wall via comprises etching.

9. The method of claim 8, wherein said etching is selected from the group consisting of sputter etching and wet etching.

10. The method of claim 8, wherein said etching comprises sputter etching after application of a resist layer over said at least one passivation layer, said resist layer having an aperture therein aligned with a portion of said solder wettable conductive trace portion on a portion of said at least one surface of said semiconductor substrate.

11. The method of claim 8, wherein said etching comprises wet etching effected after application of a resist layer over said at least one passivation layer, said resist layer having an aperture therein aligned with said solder wettable conductive trace portion of said at least one surface of said semiconductor substrate.

12. A method for making an integrated circuit comprising:
   forming a substrate including integrated circuitry and at least one conductive element connected to said circuitry, said at least one conductive element terminating in a bond pad;
   forming at least one first passivation layer over a portion of the at least one conductive element except for the bond pad;
   forming a conductive trace in contact with the bond pad of the at least one conductive element a portion of said conductive trace extending over a portion of the at least one first passivation layer, said conductive trace having an upper surface;
   forming at least one second passivation layer over a portion of the conductive trace;
   forming a sloped-wall via through the at least one second passivation layer extending to a portion of said upper surface of the conductive trace; and
   forming a solder mass having a portion extending into the sloped-wall via contacting a portion of said upper surface of the conductive trace.

13. The method of claim 12, wherein the conductive trace comprises a solder wettable material.

14. The method of claim 1, wherein the solder wettable material is copper, nickel, palladium, platinum, gold, or an alloy thereof.

15. A method for making an integrated circuit comprising:
   forming a substrate including integrated circuitry on a surface thereof, the circuitry terminating in at least one bond pad, at least one conductive trace on the surface of the substrate connected to the at least one bond pad of the circuitry and having at least one passivation layer over at least a portion of the surface of the substrate;
   forming a sloped-wall via through a portion of the at least one passivation layer over at least a portion of the surface of the substrate to expose one of at least a portion of the at least one conductive trace and the at least one bond pad; and
   forming a solder mass having a portion extending into the sloped-wall via contacting one of a portion of the at least one conductive trace and the at least one bond pad.

16. The method of claim 15, wherein the at least one conductive trace comprises a solder wettable material.

17. The method of claim 16, wherein the solder wettable material is copper, nickel, palladium, platinum, gold, or an alloy thereof.

18. The method of claim 15, wherein the one of at least a portion of the at least one conductive trace and at least one bond pad is copper, nickel, palladium, platinum, gold or an alloy thereof.

19. The method of claim 18, wherein the one of at least a portion of the at least one conductive trace and at least one bond pad is copper, nickel, palladium, platinum, gold, or an alloy thereof.

* * * * *

UNITED STATES PATENT AND TRADEMARK OFFICE
CERTIFICATE OF CORRECTION

PATENT NO.    : 6,211,052 B1
DATED         : April 3, 2001
INVENTOR(S)   : Warren M. Farnworth It is certified that error appears in the above-identified patent and that said Letters Patent is hereby corrected as shown below:

Title page,
Item [57], ABSTRACT,
Line 1, change "improve" to -- improved --

Column 4,
Line 10, after "The" insert -- first --
Lines 11 and 12, after "passivation" insert -- film --
Line 33, after "The" insert -- polyamide --
Line 34, after "film" insert -- layer --
Line 35, before "passivation" insert -- polyamide --
Line 36, after "film" insert -- layer --
Line 39, before "passivation" insert -- polyamide -- and after "film" insert -- layer --
Lines 48 and 54, after "film" insert -- layer --
Line 50, before "repattern" insert -- conductive --

Column 5,
Line 56, after "to" insert -- the --

Column 6,
Lines 5 and 24, change "a" to -- said --
Line 8, before "substrate" insert -- semiconductor --
Line 9, before "circuitry" insert -- integrated --
Line 20, after "over" change "a" to -- said --
Line 26, after "trace" insert -- of solder wettable material --
Line 29, change "element" to -- trace of solder wettable material --
Lines 33 and 46, change "the" to -- a --
Line 34, after "comprises" insert -- said --
Line 35, after "said" insert -- at least one --
Line 37, before "another" insert -- said --
Line 51, after "said" insert -- semiconductor --
Line 54, before "circuitry" insert -- integrated --
Line 57, after "one" insert -- solder wettable --
Line 62, change "the" to -- a --
Line 66, after "said" insert -- at least one --

UNITED STATES PATENT AND TRADEMARK OFFICE
CERTIFICATE OF CORRECTION

PATENT NO. : 6,211,052 B1
DATED : April 3, 2001
INVENTOR(S) : Warren M. Farnworth It is certified that error appears in the above-identified patent and that said Letters Patent is hereby corrected as shown below:

Column 7,
Line 6, after "said" insert -- at least one --
Line 12, before "circuitry" insert -- integrated --
Line 22, after "over" change "a" to -- said --
Line 28, change "a" to -- said --

Column 8,
Lines 6 and 9, before "circuitry" insert -- integrated --
Line 12, after "over" insert -- said --
Lines 24 and 28, after "one of" insert -- said --
Line 25, after "and" insert -- the --
Line 29, after "and" insert -- the --

Signed and Sealed this

Eleventh Day of February, 2003

JAMES E. ROGAN
*Director of the United States Patent and Trademark Office*